United States Patent [19]

Kestigian et al.

[11] Patent Number: 4,915,810
[45] Date of Patent: Apr. 10, 1990

[54] TARGET SOURCE FOR ION BEAM SPUTTER DEPOSITION

[75] Inventors: Michael Kestigian, Charlton Depot, Mass.; John F. Gillin, Commack, N.Y.

[73] Assignee: Unisys Corporation, Blue Bell, Pa.

[21] Appl. No.: 185,669

[22] Filed: Apr. 25, 1988

[51] Int. Cl.[4] .............................................. C23C 14/34
[52] U.S. Cl. ........................... 204/298.04; 204/192.11; 204/298.12; 204/298.13
[58] Field of Search ........... 204/192.1, 192.11, 192.12, 204/298, 298 BD, 298 TS, 298 TC

[56] References Cited

U.S. PATENT DOCUMENTS

| | | | |
|---|---|---|---|
| 4,248,687 | 2/1981 | Fan | 204/192.11 |
| 4,250,009 | 2/1981 | Cuomo et al. | 204/298 |
| 4,404,263 | 9/1983 | Hodes et al. | 204/192.12 X |
| 4,430,190 | 2/1984 | Eilers et al. | 204/192.12 X |

FOREIGN PATENT DOCUMENTS

| | | | |
|---|---|---|---|
| 3030320 | 11/1982 | Fed. Rep. of Germany | 204/298 |
| 208815 | 11/1984 | Japan | 204/298 |

OTHER PUBLICATIONS

C. Weissmantel, "Ion ... Structures", J. Vac. Science Technol., 18(2), 3 (1981), pp. 179–185.
R. Castellano, "Ion ... Targets", J. Vac. Sci. Technol., 17(2), 3/1980, pp. 629–633.
Reinhardt et al., "Electrical ... Films", Thin Solid Film, 51 (1978), 99–104.

Primary Examiner—Nam X. Nguyen
Attorney, Agent, or Firm—Albert B. Cooper; Arnold L. Albin

[57] ABSTRACT

A target for use in ion beam sputtering is arranged for varying the chemical composition of the deposited film without requiring substantial fabrication of a new target. The target is comprised of a disc having therein a plurality of openings which extend only part way through the disc. The target is fabricated from a predetermined chemical composition similar to that desired to be deposited. The openings within the target are filled with plugs of a varied chemical composition. By choice of the number of plugs and their composition, as well as the size of the plug, the structure of the film may readily be varied to a small degree or a large degree. The invention is applicable to all methods of deposition that use a target as a source of material for the film.

9 Claims, 1 Drawing Sheet

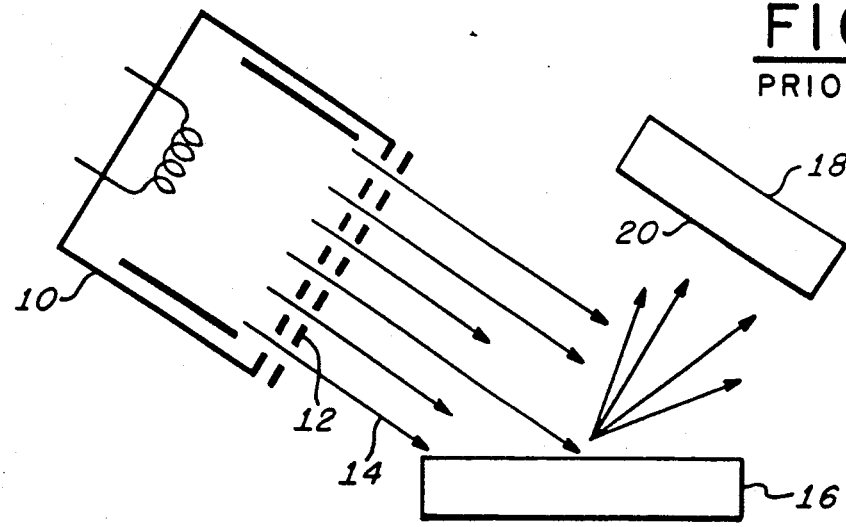
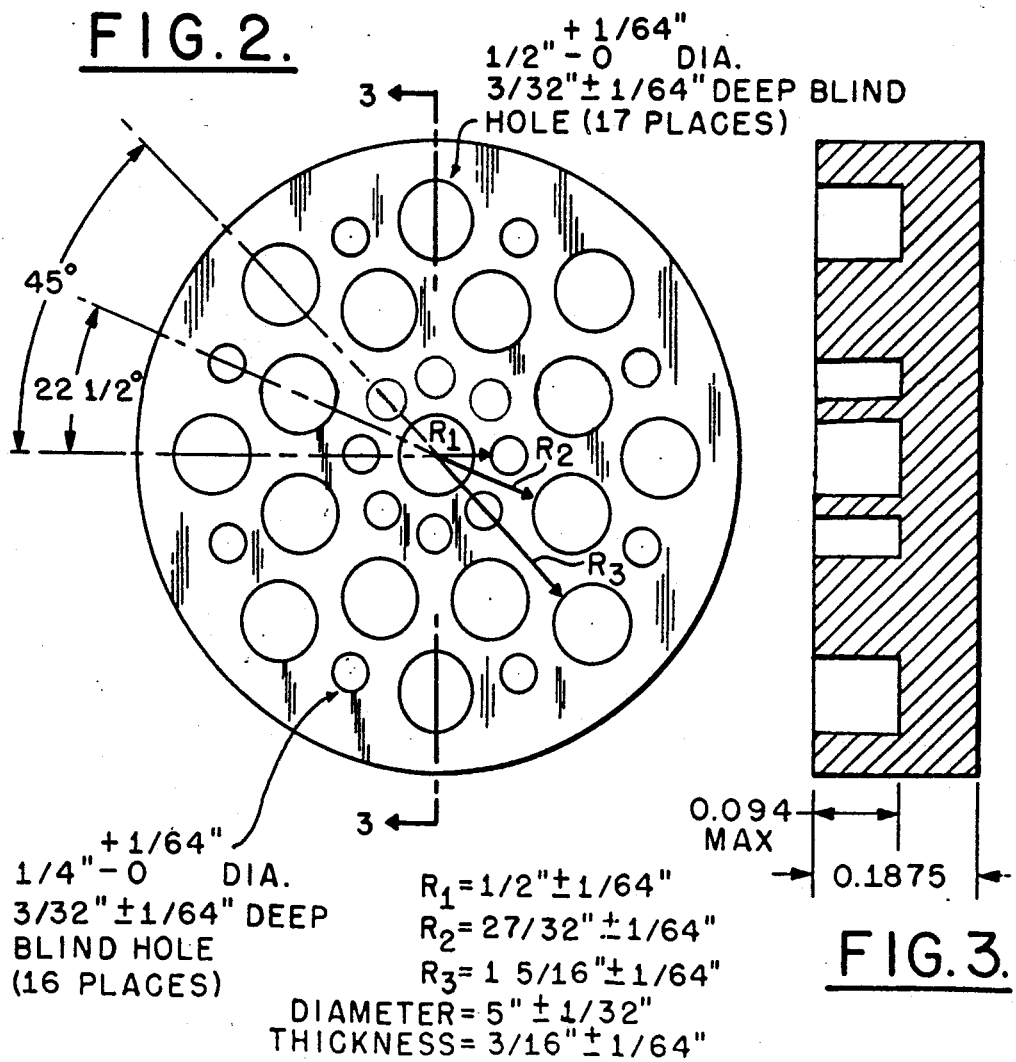

TARGET SOURCE FOR ION BEAM SPUTTER DEPOSITION

BACKGROUND OF THE INVENTION

1. Field of the Invention

The invention relates generally to a target source for film deposition, and more particularly to a target source for depositioning films of a complex chemical composition using ion beam sputtering techniques.

2. Description of the Prior Art

Sputter deposition processes using ion beam sources are found in a variety of applications. The advantages of using ion beam sputter deposition are isolation of the substrate from energetic electron bombardment and independent control over the ion energy and current density striking the target. The basic techniques of ion beam sputter deposition are well known in the art. See, for example, H. R. Kaufman, J. J. Cuomo and J. M. E. Harper, Technology and Applications of Broad-Beam Ion Sources Used in Sputtering, J. Vac. Sci. Technol., 21, (3), Sept./Oct. 1982. The process in general involves the use of a low energy plasma source in a magnetic field which develops a neutralized ion beam, with the ion energy, direction, and current density all independently controllable and all independent of the type of target used. The plasma is produced by direct current electron bombardment of a low pressure gas, generally inert, but which may have a small percentage of reactive gases.

Generally, any target material which can be physically emplaced in a vacuum chamber can be sputtered by this process. This includes powders and composite targets, as well as elemental materials. When an insulating target is used, a neutralizer is required to avoid positively charging this insulator surface. Such charging may cause sparking across the target surface, voltage breakdown through the target, or deflection of the ion beam. A neutralizer will supply electrons and avoids surface charging.

In depositing a film of a given chemical composition, where the target is relied on as the primary source of material, it is accepted practice to prepare the target from a given composition. The target source is typically 4 to 8 inches in diameter, depending on the size of the enclosure, and nominally 0.1 to 0.3 inch thick. It is prepared by mixing the desired proportions of chemical reagents and pressing the powders together at elevated or room temperature. However, where multi-component targets are utilized, such effects of ion bombardment as preferential sputtering, formation of an altered surface layer, enhanced diffusion, surface texturing, compound formation and phase transformation may strongly influence the resultant film. Further, the film composition is not necessarily the same as the target composition due to differences in ion sputtering coefficients and film sticking coefficients.

The prior art has relied on making several iterations of target materials to achieve film depositions of desired chemical composition. This is an expensive and time consuming empirical procedure and has not been wholly satisfactory. An alternative approach to depositing multi-component films used in the prior art is to allow the beam to strike a segmented target. As reported by Harper, et al (op.cit.) cermets of $Ag/SiO_2$ were deposited over a range of compositions of 55–92-wt. % Ag using two adjacent targets of Ag and $SiO_2$. (Originally reported by P. Reinhardt, et al, Thin Solid Films 51, 99 (1978). As reported therein, the film composition was controlled by lateral positioning of the targets in the beam to sputter varying fractions of the two targets, thereby allowing the film resistivity to be varied over a range of six orders of magnitude. Thus, target texture is seen to affect film composition.

It is clear, therefore, that elemental sputter yields may not be used to predict sputter yields in alloys or components and that the sputter yield ratios in alloys may be strongly composition dependent. Therefore, in thin film deposition using ion sputtering, the final film composition is difficult to predict.

The present invention provides an improved target source that allows modification of the target composition in precisely controlled increments without the necessity for fabricating an entirely new target.

SUMMARY OF THE INVENTION

The present invention comprises a source of plasma disposed within a chamber, an intermediate target angularly disposed in relationship with the source of plasma and in angular relationship with a substrate, the target being comprised of a composite matrix of material to be deposited upon the substrate and including a plurality of openings, each of the openings having an aspect ratio of between 0.1875 and 0.375 and a predetermined depth of one-half the thickness of the target, and a plurality of plugs of predetermined composition, adapted for a press fit and disposed within the openings, so that ions are made to collide against the target and liberate particles of materials of which the target and plugs are made, thereby depositing a thin film of the particles in a further predetermined composition on the substrate.

In a preferred embodiment, the target has a thickness between $\frac{1}{8}$ to $\frac{1}{4}$ inch and the holes have a diameter between $\frac{1}{4}$ to $\frac{1}{2}$ inch. The plugs may be ranged in a pattern and comprised of one or more compositions.

BRIEF DESCRIPTION OF THE DRAWINGS

FIG. 1 is a schematic illustration of the essential portion of the ion sputtering apparatus of the prior art.

FIG. 2 is a plan view of the target configuration of the present invention.

FIG. 3 is a sectional view through the target of FIG. 2.

DESCRIPTION OF THE PREFERRED EMBODIMENT

FIG. 1 is a diagrammatic illustration of the prior art apparatus. A direct current is applied to an ion gun 10 which is equipped with extraction grids 12. The chamber of ion gun 10 is filled with a gaseous composition and, when energized, ion gun 10 produces an ion beam 14 which is incident on target 16. Target 16 is conventionally a solid disc of a desired composition to be deposited as a film of substantially the same composition upon a substrate 18. Sputtered material 17 from target 16 is angularly deflected and impinges on the surface 20 of substrate 18 where it is deposited in the form of the film. The rate of deposition is a function of the relative angles of the ion gun and target and the target and substrate. It will be appreciated by one skilled in the art that although FIG. 1 shows sputtering apparatus in which portions having no direct relationship with the present invention are omitted, and actual sputtering apparatus will include various known means required to affect sputtering, such as means for introducing gas into the chamber of ion gun 10, means for evacuating the interior of the vacuum chamber, and a neutralizing element.

As will be evident from the above description, considerable experimentation is required to obtain adjustment of the deposition parameters in order to achieve a desired film chemical composition. These parameters include beam voltage, beam current, accelerating current, gaseous composition, gaseous pressure, deposition temperature, and angular disposition of the target and substrate.

When the above-described variables do not yield the desired film composition, the target disc may be fitted with a pattern of holes drilled through no more than ½ the target thickness, as shown schematically in FIG. 2 and FIG. 3. In FIG. 2, the target disc is provided with a plurality of drilled holes, which may range form ¼ to ½ inch in diameter, and preferably to 3/32 inch deep, thereby providing an aspect ratio of between 0.1875 and 0.375. Typically, the holes are arranged in a pattern which may consist solely of small holes, large holes, or sequentially alternating large and small holes. For a target disc 5 inch in diameter, a thickness of 3/16 inch is suitable, with the holes drilled to a depth of 3/32 inch. In the example shown, the holes are disposed radially at an angle of 22½° or 45° from one another, although this is merely exemplary and is not to be construed as limiting.

Plugs with composition differing from the target disc are fitted into some or all of the holes as required to provide a desired film chemical composition. Plugs can readily be removed, added, or changed in chemical composition to achieve the desired film chemical composition without refabricating the bulk target itself. Holes not filled with plugs do not cause concern, as they expose the same chemical composition as the bulk target material. This novel concept in target design is possible and successful because it was recognized that a homogeneous chemical film composition results from a non-homogeneous target composition if the proper mixing of the sputtered species is allowed to occur in the deposition process. The invention can be used to obtain not only films with a given pure chemical composition but also films in which the bulk matrix is deliberately activated or doped with one or more activator ions. While the preferred embodiment employs ion beam deposition equipment, the invention is applicable to all equipment that uses a target as a source of material in the deposition of films or material, such as r.f. sputtering and magnetron sputtering. Vacuum deposition should be deleted because it encompasses techniques that do not utilize targets, i.e., e-beam, thermal evaporation.

In operation, plugs of a desired phase are carefully determined and prepared. The preparation of plugs follows well known procedures of chemistry. Chemicals of adequate purity are dried, carefully weighed and intimately mixed. After a precalcination at the required elevated temperature under suitable environmental gaseous conditions, plugs of the desired dimensions to form a press fit with the target are formed on a press. A further high temperature calcination may be performed as necessary. In one example, a lutetium iron garnet matrix is drilled with 32 ¼ inch diameter and 17 ½ inch diameter holes similar to that depicted in FIG. 2. In this example, 19 of the ¼ inches holes and 13 of the ½ inch diameter holes were fitted with plugs of composition $Bi_3Fe_5O_{12}$. One ¼ inch diameter hole is fitted with a plug of composition $BiFeO_3$. After the plugs were pressed in place, the vacuum chamber was evacuated to $1\times10^{-8}$ Torr and then held at a vacuum for a minimum of 16 hours. The working gases were then introduced. These gases were $2.0\times10^{-4}$ Torr oxygen supplied near the target; $1.25\times10^{-4}$ Torr xenon supplied to the plasma of the bridge neutralizer (not shown) and $1.6\times10^{-4}$ Torr xenon supplied to the ion source. A stable ion beam is extracted and used to clean the target for 15 minutes during which time the substrate is shielded by a shutter (not shown). After the target cleaning step, the shutter is opened and film deposition onto the substrate proceeds. A beam voltage is 1300 volts and a current of 110 milliamps. at an acceleration potential of 300 volts were used during the deposition. These conditions, for dimensions of the apparatus used (target to substrate, target from ion beam source, etc.) which are well known to one skilled in the art, yielded a film thickness deposition of 100 Angstroms per minute. Carefully cleaned and polished one inch diameter gadolinium gallium garnet wafers were used as a substrate. The composition of the garnet film obtained after a post deposition and annealing step was nominally $Lu_2Bi_1Fe_5O_{12}$ in this example.

In another example, the base target was $Y_3Fe_5O_{12}$ and the pellets contained $Bi_2O_3$, $BiFeO_3$, and $Bi_3Fe_5O_{12}$ as determined by molar ratios. Using these pellets, films of composition $Y_{(3-x)}B_{(x)}$, $Fe_5O_{12}$, where $0 < X < 13$, have been obtained. By altering the number of pellets, different values of x have been obtained as evidenced by observation of differing optical magnetic and magnetooptic properties of the films.

The number and composition of the plugs to be used to provide a desired composition may be varied, considering the difference in chemical composition of the bulk of target source and the desired deposited film, the surface areas of the plugs and the target disc exposed to the beam and the composition of the plugs and target disc. Alterations in the target (and consequently the film) chemical composition may be made by the addition or removal of plugs. Minor alterations may be had by the substitution of plugs of a varied chemical composition.

It may be seen that the novel invention provides a target source which permits a wide range of chemical compositional changes to be made. These changes may be made not only to adjust the chemical composition of a desired film which is deposited from a given target composition, but also can be utilized in the deposition of homogeneous films wherein the chemical composition may be easily, conveniently and efficiently modified therefor. The invention is further advantageous in that it permits the use of a single target disc to be used to produce many films of different chemical compositions and enables the investigator to precisely duplicate any previous composition on demand. It is clearly advantageous over the prior art which requires the fabrication of a completely different target disc each time, while with the present invention a much shorter time, operation down time and resultant expense is required to arrive at a desired film composition.

While the invention has been described in its preferred embodiments, it will be understood that the words which have been used are words of description rather than limitation and that changes within the purview of the appended claims may be made without departure from the true scope and spirit of the invention in its broader aspects.

We claim:

1. A sputtering apparatus comprising:
a source of plasma disposed within a chamber and having a predetermined pattern of ion beam intensity,
an intermediate target angularly disposed in relationship with said source of plasma and in angular relationship with a substrate, said target comprising a matrix of material to be deposited upon said substrate and including a plurality of bore,, said bores disposed in a predetermined radial pattern comprising an axial bore of a first predetermined diameter, a first plurality of radially disposed bores of a second predetermined diameter surrounding said axial bore, a second plurality of radially disposed bores of said first predetermined diameter surrounding said first plurality, and a third plurality of radially disposed bores surrounding said second plurality and of diameters alternating between said first predetermined diameter and said second predetermined diameter, each of said bores having an aspect ratio of between 0.1875 and 0.375 and a predetermined depth of one-half the thickness of said target, and
a plurality of plugs of predetermined composition, adapted for a press fit and disposed within said bores,
wherein ions are made to collide against said target so as to liberate particles of materials of which said target and said plugs are made, thereby depositing a thin homogeneous film of said particles in a further predetermined composition on said substrate.

2. A sputtering apparatus as set forth in claim 1, wherein said target has a thickness between $\frac{1}{8}$ to $\frac{1}{4}$ inch, and said first predetermined diameter exceeds said second predetermined diameter by a ratio of 2:1.

3. A sputtering apparatus as set forth in claim 2, wherein said substrate is disposed in face-to-face relationship with said target.

4. A sputtering apparatus set forth in claim 2, wherein said plugs are comprised of a rare earth composition.

5. A sputtering apparatus as set forth in claim 4, wherein said plugs and said bores have a circular cross-section.

6. A sputtering apparatus as set forth in claim 4, wherein said plugs have a rectangular cross-section.

7. A sputtering apparatus as set forth in claim 4, wherein said matrix is a material selected from the group of rare earth metals including yttrium iron garnet and lutetium iron garnet and said substrate is comprised of gadolinium garnet.

8. A sputtering apparatus as set forth in claim 7, wherein said plugs are selected from the group of materials including $BiFeO_3$, $Bi_2O_3$, and $Bi_3Fe_5O_{12}$.

9. A sputtering apparatus as set forth in claim 1, wherein said matrix is comprised of a composite of chemical elements.

* * * * *